United States Patent
Jerred

(10) Patent No.: US 6,703,664 B1
(45) Date of Patent: Mar. 9, 2004

(54) POWER FET DEVICE

(75) Inventor: Paul Anthony Jerred, Manchester (GB)

(73) Assignee: Zetex PLC, Chadderton Oldham (GB)

( * ) Notice: Subject to any disclaimer, the term of this patent is extended or adjusted under 35 U.S.C. 154(b) by 0 days.

(21) Appl. No.: 09/446,815

(22) PCT Filed: Jun. 26, 1998

(86) PCT No.: PCT/GB98/01709

§ 371 (c)(1),
(2), (4) Date: Mar. 31, 2000

(87) PCT Pub. No.: WO99/00850

PCT Pub. Date: Jan. 7, 1999

(30) Foreign Application Priority Data

Jun. 26, 1997 (GB) ............................................. 9713375

(51) Int. Cl.⁷ ........................ H01L 29/76; H01L 29/94; H01L 31/062
(52) U.S. Cl. ........................ 257/341; 257/339; 257/342
(58) Field of Search ................................ 257/335, 339, 257/341, 342

(56) References Cited

U.S. PATENT DOCUMENTS 5,757,046 A * 5/1998 Fujihira et al. ............. 257/339

FOREIGN PATENT DOCUMENTS

JP 63-152174 * 6/1988 ................. 257/341

* cited by examiner

Primary Examiner—Steven Loke
(74) Attorney, Agent, or Firm—Morrison & Foerster LLP

(57) ABSTRACT

A power FET device includes a semiconductor wafer substrate having first and second surfaces, a gate electrode extending over the first surface of the substrate but insulated therefrom, and a drain electrode extending over the second surface of the substrate. The gate electrode defines a regular array of apertures. An FET body region of a first conductivity type is formed in the first surface of the substrate beneath each gate electrode aperture, each body region extending laterally from edges of the gate electrode defining the aperture. An FET source region of a second conductivity type is formed within the body region beneath each gate electrode aperture, each FET source region extending from the edges of the gate electrode a second distance less than the first distance. An FET channel region extends around the periphery of each source region. Pairs of adjacent gate electrode apertures define there between a strip of gate electrode the width of which varies along the length of the strip. As a result body dopant introduced through adjacent gate electrode apertures merges to form a single body structure extending continuously beneath the apertures.

11 Claims, 9 Drawing Sheets

POWER FET DEVICE

This application is the national phase under 35 U.S.C. §371 of prior PCT International Application No. PCT/GB98/01709 which has an International filing date of Jun. 26, 1998.

FIELD OF THE INVENTION

The present invention relates to a power field effect transistor (FET) device.

DESCRIPTION OF THE RELATED ART

Known power FET devices comprise a semiconductor wafer substrate upon which a series of structures is defined, each structure forming a single FET element arranged such that all of the individual FET elements are connected in parallel. The semiconductor wafer defines first and second surfaces, a gate electrode extends over the first surface of the substrate, and a drain electrode extends over the second surface of the substrate. The known devices can generally be categorised as either of "cellular" design or "stripe" design.

In cellular designs, the gate electrode defines a regular army of rows and columns of apertures, each aperture defining the location of one FET element. During fabrication, an FET body region of a first conductivity type is formed through each of the gate apertures such that an array of body regions is formed in the first surface of the substrate, each body region being located beneath a respective gate electrode aperture and extending laterally under the edges of the gate electrode defining that aperture. A source region of a second conductivity type is then formed in each of the body regions through the apertures in the gate electrode, the source regions extending laterally beneath the aperture edges into the body region. The source regions do not extend to the peripheral edges of the body regions and therefore channel regions are defined in the body regions around the source regions and beneath the gate electrode. The gate electrode is electrically isolated from the substrate by a layer of gate oxide.

Current flow through the device is controlled by controlling a voltage applied between the gate electrode and a source electrode which contacts each of the source regions through the apertures in the gate electrode. Current passes vertically through The substrate between the source and drain electrodes via the channel regions which extend around the circumference of each of the gate electrode apertures.

One known cellular design is described in U.S. Pat. No. 5,008,725. In that design, a plurality of simple hexagonal-shaped body regions, each containing a source region, are closely packed on one surface of a semiconductor body. Gate electrodes extend between adjacent sources and control conduction from the source electrode through the channels and then to a drain electrode on the opposite surface of the semiconductor body. Each source overlies a p-type body region, the body regions of adjacent FET elements being separated by n-type material through which current flows between the source and drain after passing laterally through the channels beneath the gate electrodes. The use of a basic hexagonal structure makes it possible to ensure a constant spacing between adjacent edges of the sources and thereby enables a large number of small hexagonal source elements to be formed in a given area of semiconductor body.

In "stripe" designs, rather than relying upon an array of rows and columns of cells, a single column of elongate structures is formed, each elongate structure defining one "stripe". The gate electrode defines a column of elongate slot-like apertures, each aperture defining the location of one FET element Body and source regions are forced through each of the apertures and extend laterally beneath the edges of the apertures.

It is known that the DC on resistance of FET's is a function of the total peripheral source region edge length, which in turn is a function of the total length of the gate electrode aperture edge. This length can be made greater in cellular designs than in stripe designs, and therefore cellular designs have been preferred in applications in which DC on resistance is of primary importance. It is also known however that the AC switching performance of FET's is a function of the gate/drain overlap area (the area beneath the gate electrode not occupied by body region). This area is greater in cellular designs than in stripe designs, and therefore stripe designs have been preferred in some applications in which AC switching performance is of primary importance.

U.S. Pat. No. 5,521,410 describes an alternative design which seeks to achieve a relatively long gate electrode aperture edge by using complex elongate source region shapes. In that arrangement, square openings are formed in a gate electrode, and pairs of the square openings are connected by slits. With such an arrangement, although only a relatively small number of source regions can be provided in a given substrate area, the slits provide a relatively long source region edge. The body region of each basic double opening and slit arrangement extends by the same distance laterally relative to all of the structure and as a result the distance between adjacent body regions can be vent small (in one of the illustrated examples only 0.04 micrometers). In a practical device, given fabrication tolerances and errors, adjacent body regions might contact each other, but only to a limited and accidental extent.

It is an object of the present invention to provide an improved power FET device which may have a relatively large source region edge length per unit area and a relatively small gate/drain overlap area.

SUMMARY

According to the present invention, there is provided a power FET device comprising a semiconductor wafer substrate defining first and second surfaces, a gate electrode extending over the first surface of the substrate, the gate electrode defining a regular array of apertures and being insulated from the substrate, a drain electrode extending over the second surface of the substrate, an FET body region of a first conductivity type formed in the first surface of the substrate beneath each gate electrode aperture and extending a first predetermined lateral distance from edges of the gate electrode defining the aperture, an FET source region of a second conductivity type formed within the body region beneath each gate electrode aperture, each FET source region extending a second predetermined lateral distance from the edges of the gate electrode defining the aperture, a source electrode interconnecting source contacts located beneath each of the gate electrode apertures, and an FET channel region defined around the periphery of each of the source regions beneath the gate electrode, each gate electrode aperture being separated from at least one adjacent gate electrode aperture by a strip of gate electrode the width of which varies along the length of the strip between a maximum which is substantially greater than twice the first distance and a minimum which is substantially greater than twice the second distance and substantially less than twice the first distance, whereby a single body structure extends continuously between the said adjacent gate electrode apertures at each position of minimum inter-aperture width due to lateral merging of the body regions at each such position.

The invention also provides a method for forming a power FET device, wherein a gate electrode is formed on a first surface of the semiconductor wafer substrate, the gate electrode defining a regular array of apertures and being insulated from the substrate, a drain electrode is formed on a second surface of the substrate, an FET body region of a first conductivity type is formed in the first surface of the substrate beneath each gate electrode aperture so as to extend beneath edges of the gate electrode apertures, an FET source region of a second conductivity type is formed within the body region beneath each gate electrode aperture so as to extend beneath the edges of the gate electrode apertures, and a source electrode is formed to interconnect source contacts located beneath each of the gate electrode apertures, an FET channel region being defined in the body region around the periphery of each of the source regions beneath the gate electrode, the edges of the gate electrodes being shaped and positioned such that each gate electrode aperture is separated from at least one adjacent gate electrode aperture by a strip of gate electrode the width of which varies along the length of the strip between a maximum and a minimum, the body regions being formed such that each extends a distance beneath the aperture edges greater than half the minimum width but less than half the maximum width, whereby the body regions merge beneath minimum width portions of the strip, and the source regions being formed such that each extends a distance beneath the aperture which is less than half the minimum width.

Accepting that the width of the electrode strips between adjacent apertures is in parts less than twice the distance that the body region extends laterally beneath each aperture edge whereby a continuous body region is formed, means that adjacent structures can be very close to each other. Given that each electrode strip is of variable width, the edge length of each strip is relatively large as compared with the overall length of the strip. There is some loss of performance for the resultant channel width as a result of the merging of body portions of adjacent structures, which merging means that some current must flow from the channel regions laterally towards portions of the structure which are not occupied by the continuous body structure but it is believed that by appropriate selection of the detailed shape of the edges of the electrode strips, in situations in which the requirements of voltage capability, function depths and manufacturing line width tolerances are suitable this effect can be more than compensated for by the associated increase in source region edge length.

Each aperture edge may comprise aligned linear end portions on either side a central portion of for example rectangular configuration such that the strip edge length corresponds to the overall strip length plus twice the width of the rectangular central section. Alternative shapes are possible however. For example, the central portion could be generally triangular, or may comprise a first generally rectangular portion defined between a first pair of parallel edges and a second generally triangular portion defined by a second pair of edges which extend between the first pair.

Embodiments of the present invention will now be described, by way of examples with reference to the accompanying drawings, in which:

DETAILED DESCRIPTION

Referring to FIGS. 1 to 7 of the accompanying drawings, an n+ substrate 1 has an n− epitaxial layer 2 formed upon it. A gate oxide layer 3 is grown on the epitaxial layer 2 and a polysilicon gate electrode layer 4 is deposited on the gate oxide layer 3.

Figure 1:
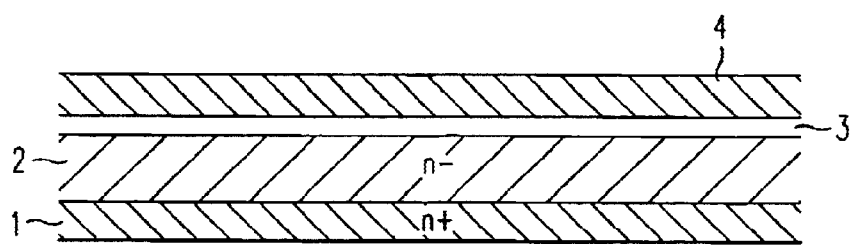
FIG. 1 illustrates in section a substrate upon which a series of layers have been formed and which is subsequently processed to define a vertical double-diffused MOSFET.
Figure 2:
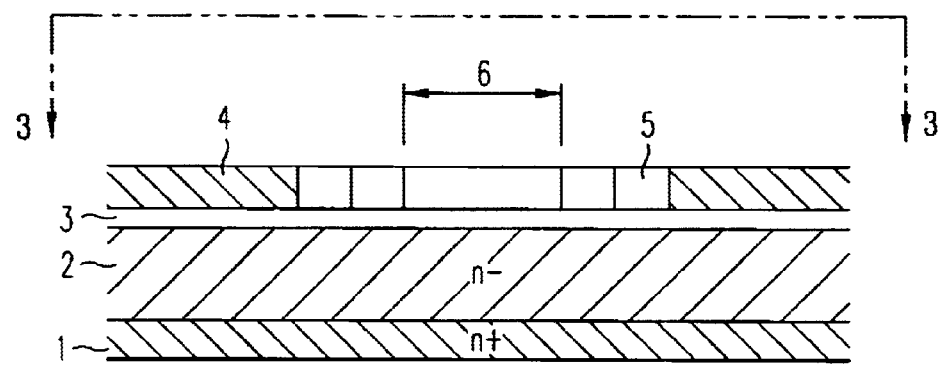
FIGS. 2 and 3 illustrate the formation of apertures in an uppermost layer of the structure illustrated in FIG. 1, each aperture defining the location at which body and source dopants are subsequently introduced, FIG. 2 being a view on line 2—2 of FIG. 3, and FIG. 3 being a view on line 3—3 of FIG. 2.
Figure 3:
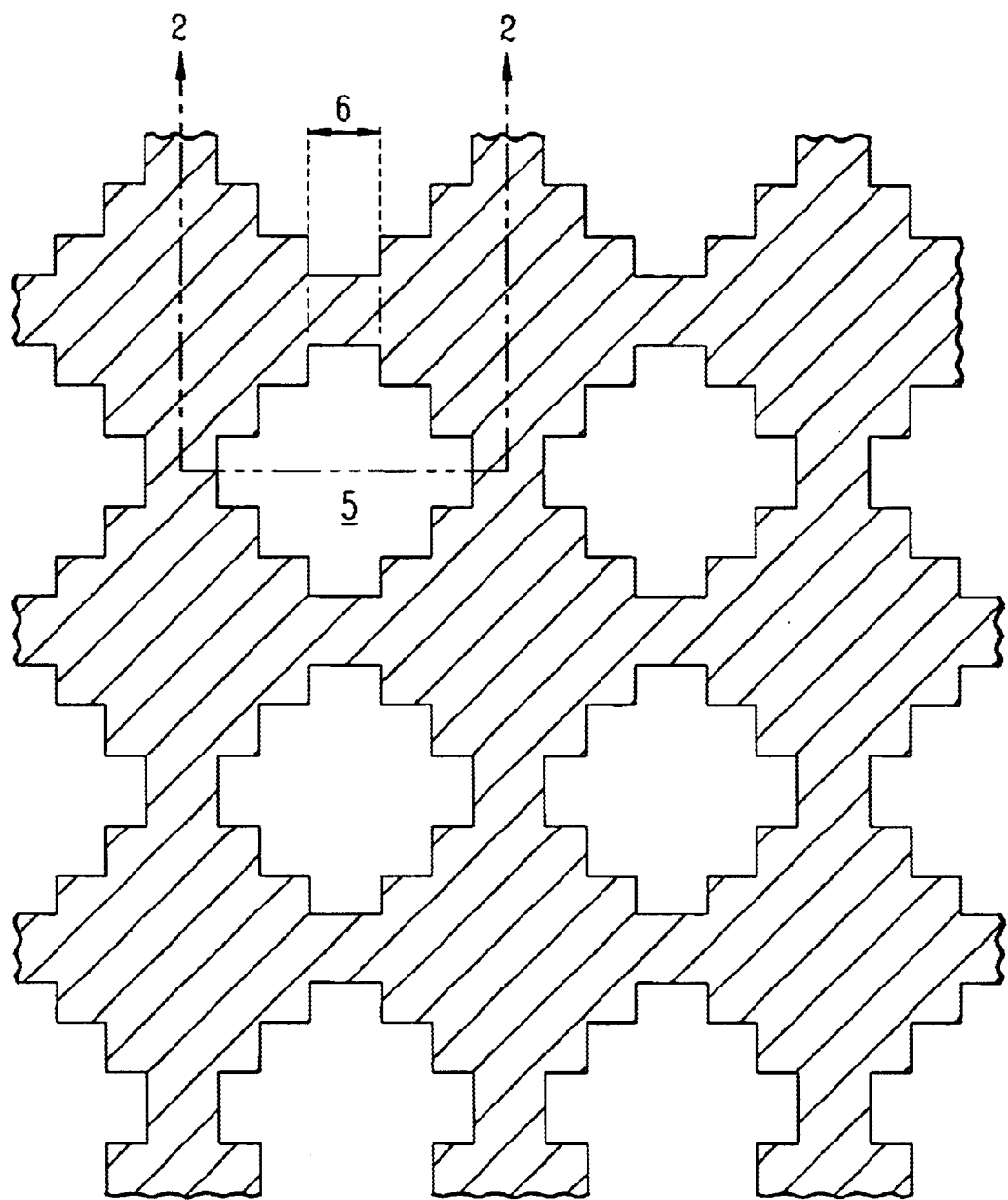

Referring to FIGS. 2 and 3, the gate electrode 4 is etched away at regular intervals to define an array of apertures 5 the edges of which take the "castellated" form shown in FIG. 3, that is each aperture can be considered to be square in general outline with each of the four sides of the square being extended by a central rectangular portion the width 6 of which corresponds to the minimum line width of the technology being used to define the gate electrode apertures. For example, each of the apertures 5 may be defined by applying a layer of resist over the polysilicon gate layer 4, masking the resist, exposing the mask, removing the resist from areas exposed through the mask, and using a dry etch, for example reactive ion etching, to provide accurate edges for the apertures 5.

Figure 4:
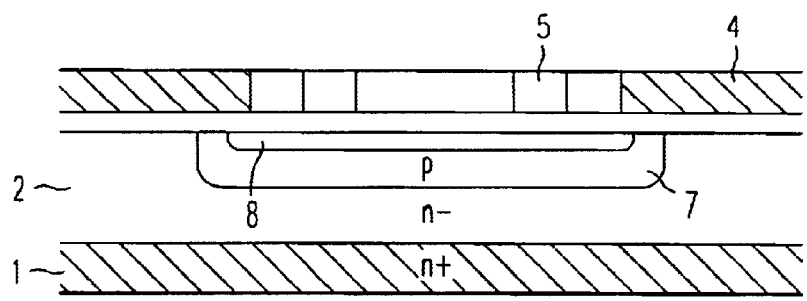
FIG. 4 illustrates the formation of a p-type body region and an n-type source region through the aperture defined in the gate electrode of FIGS. 2 and 3.

Referring to FIG. 4, boron is then implanted through the apertures 5 to define a p-type region 7, the gate electrode 4 acting as a mask for the boron implantation. The implanted boron is driven in using heat so as to extend a significant distance into the n− layer 2 and laterally beneath the edges of the gate electrode 4.

After the formation of the p-type region 7, an n+ region 8 is implanted through the same apertures 5, again using the gate electrode 4 as a mask. The n+ dopant is also driven in by heating the structure, but at a substantially lower temperature than that used to drive in the region 7. As a result although the n+ region 8 does extend into the p− region 7 and beneath the edges of the gate 4 around the apertures 5, the extent of such penetration is relatively limited.

Figure 5:
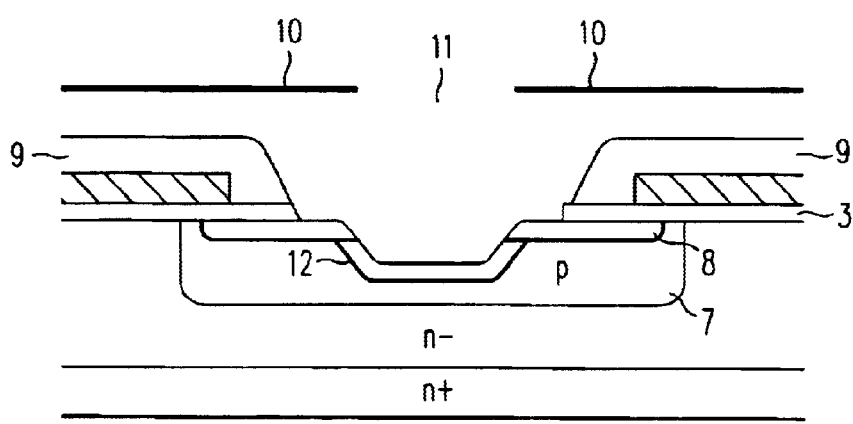
FIG. 5 illustrates the structure of FIG. 4 after further processing steps in which source region contacts, etched silicon body shorts and p+ regions have been defined within the gate electrode apertures.

Referring to FIG. 5, the structure of FIG. 4 is then covered with an oxide layer 9. A mask 10 is then located over the structure, the mask 10 defining a square aperture 11 the side lengths of which correspond to the minimum line width of the oxide-patterning technology being used. Each aperture 11 is centrally located over an aperture defined by the gate electrode 4. A layer of resist previously deposited over the oxide layer 9 is exposed through the apertures 11 and the exposed portions of the resist are removed in a conventional manner. An essentially anisotropic dry reactive ion etching step is then performed to define a hole in the oxide layer 9, to define a hole in the oxide layer 3, to remove a central portion of the n+ region 8, and to etch away part of the central portion of the p− region 7. With the apertured resist layer still in position, further boron is implanted into the exposed central portion of the region 7 so as to form a p+ region 12. An essentially isotropic wet oxide etch step is then performed which laterally cuts back the edges of the oxide layers 3 and 9 as shown in FIG. 5 and exposes a portion of the upper edge of the n+ region 8. This wet etch stage does not affect the n+ region 8 or the p+ region 12.

Figure 6:
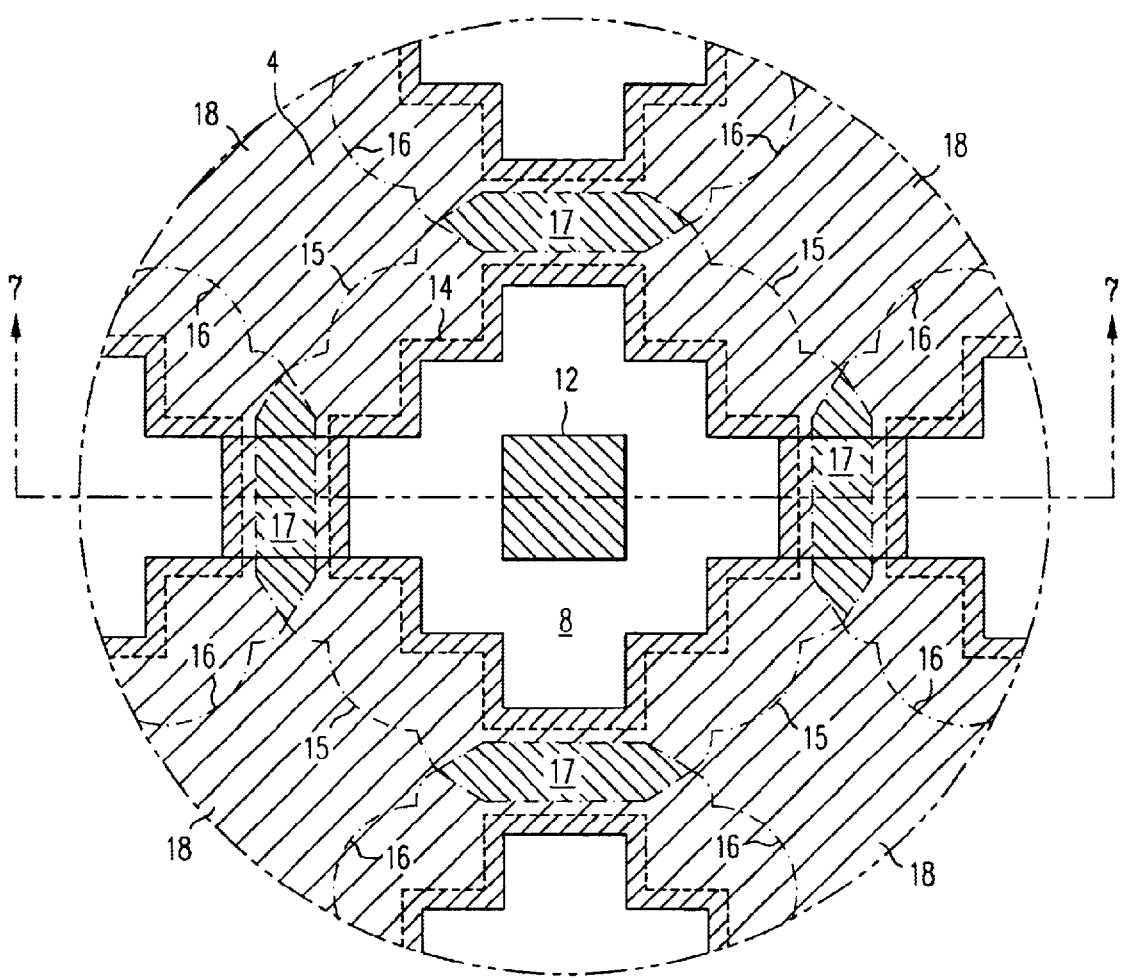
FIG. 6 is a partially cut-away plan view of the arrangement illustrated in FIG. 5 showing the relative dispositions of the different regions formed around each gate electrode aperture.
Figure 7:
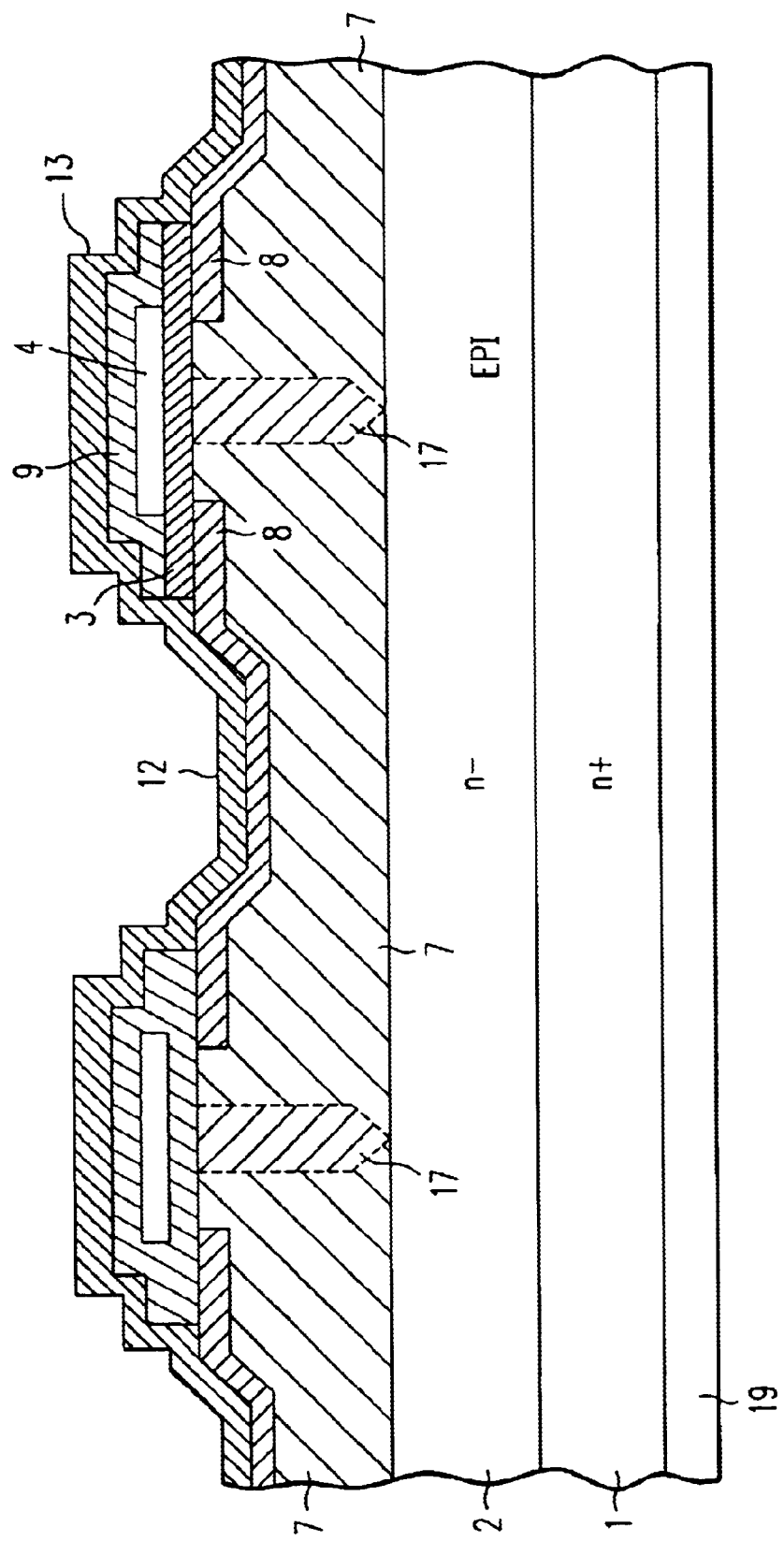
FIG. 7 is a section through the arrangement of FIG. 6 taken on the line 7—7 of FIG. 6, the section including oxide and source electrode layers omitted from FIG. 6 for the purposes of illustration.

After removal of the resist from the structure as illustrated in FIG. 5, an anneal, and activation of the implanted boron forming region 12, a continuous metallic electrode is deposited over the structure so as to contact the regions 8 and 12. FIG. 7 shows the electrode 13 and the relative disposition of adjacent cells in the structure. FIG. 6 is a plan view of the structure of FIG. 7 omitting the electrode 13 but showing the boundaries of the regions 8 and 12 beneath the edges of the gate electrode 4. In FIG. 7, the layers 3 and 9 are shown separately around the right-hand electrode strip 4, although it will be appreciated that these two layers form a single body of oxide surrounding the gate electrode as shown on the left-hand side of FIG. 7.

Referring to FIG. 6, it will be noted that the p+ region 12 is exposed through a square aperture in the n+ region 8. The peripheral edge of the n+ region 8 is indicated by broken line 14. It will be noted that the n+ region 8 of one cell does not contact the n+ region of any adjacent cell. The broken line 15 represents the peripheral edges of the p− region 7 which would be formed beneath the aperture which is shown in the centre of FIG. 6 if dopant was introduced only through that aperture. Further broken lines 16 indicate where the peripheral edges of body regions of each one of the four adjacent apertures would be located, again if dopant was only introduced through that one aperture. The hatched areas 17 represent regions in which the body regions "overlaps", although it will be appreciated that given the physical processes which occur during dopant diffusion simultaneously formed body regions will not "overlap", but rather will merge to form a single body structure. That body structure extends continuously from beneath one gate electrode aperture to beneath each adjacent gate electrode aperture, and is itself penetrated by regions 1 of the n− epitaxial layer 2 which are located at a distance from the nearest gate electrode aperture edge greater than the distance which dopant forming the body region 7 is diffused laterally from the aperture edges.

Referring to FIG. 7, an electrode 19 is defined on the underside of the n+ substrate 1 to define a drain electrode. The electrode 13 defines a source electrode. The gate electrode 4 which extends beneath the electrode 13 but is insulated therefrom by the oxide layer 9 extends laterally to a point or points at which it is connected to a gate bonding pad (not shown). Thus the device can be readily connected to source, drain and gate terminals.

As described above, each aperture formed in the gate electrode 4 can be considered as being essentially square, with a central section of each edge of each square being extended outwards to form a rectangular extension and thereby define the illustrated castellated shape. Each pair of adjacent apertures thus defines a strip of gate electrode therebetween the overall length of which is equal to the length of the side of the aperture squares, but the side edge length of which is equal to the overall length plus twice the depth of the rectangular extension. Thus for any given square geometry, the strip edge length is significantly increased as compared with the overall length.

Given the castellated shape, each strip of gate electrode separating adjacent apertures has a central section the width of which is substantially less than twice the distance which the p− region 7 extends beneath the electrode, hence the merging of adjacent p− regions. The end portions of the strip are relatively wide however, hence the existence of the n− regions 18 extending between the drain electrode 19 and the oxide layer 3 outside the boundaries 15 and 16.

Using fabrication technology which is capable of accurately forming line widths of the order of 1.4 micrometers, an aperture pitch of 7.3 micrometers with a source contact hole dimension 6 as shown in FIG. 2 of 1.4 micrometers, a side dimension for each square aperture of 3.8 micrometers, a depth for each outwardly extended section of 0.95 micrometers, a length for each outwardly extended section of 1.6 micrometers, and a minimum electrode strip width between apertures of 1.6 micrometers, are achievable. This represents a very high density structure.

When the device is switched on by the application of a DC voltage to the gate electrode 4, current flows from source to drain through the annular channel region around each cell. All cells in the array conduct together "in parallel". The resistance to current flow is inversely related to the net peripheral width of the channel which in turn is a function of the gate edge length per unit area. In the described arrangement, the gate edge length is relatively large as a result of the "castellated" form of the openings defined in the gate electrode 4. A relatively large number of cells per unit area can be provided given that the design accepts the merging of the p− regions 7 of adjacent cells to form a single continuous body structure. The rectangular extensions from the basic square opening configuration do not themselves incorporate source contact holes but rely instead upon lateral current flow within the diffused source region 8 to the source electrode 13.

Given that the rectangular extensions to the basic square gate electrode opening do not have to accommodate source region contact holes, the extensions can be defined with a line width less than that required for the definition of the basic square shape (which has to accommodate the central source contact opening). Thus the extensions can be used such that they effectively increase the source edge length per unit area with respect to that which can be achieved using a simple square geometry. In the completed device, the active area is formed by a single apertured body or base structure, defined by the merged p− regions 7, and containing within it an array of separate source regions.

It will be appreciated that shapes other than that illustrated in FIGS. 1 to 7 can be used to achieve the desired increase in source region edge length. For example, the rectangular extensions of the illustrated embodiment could be replaced by triangular extensions, or any other convenient shape. FIGS. 8 to 17 illustrate such alternative configurations.

Figure 8:
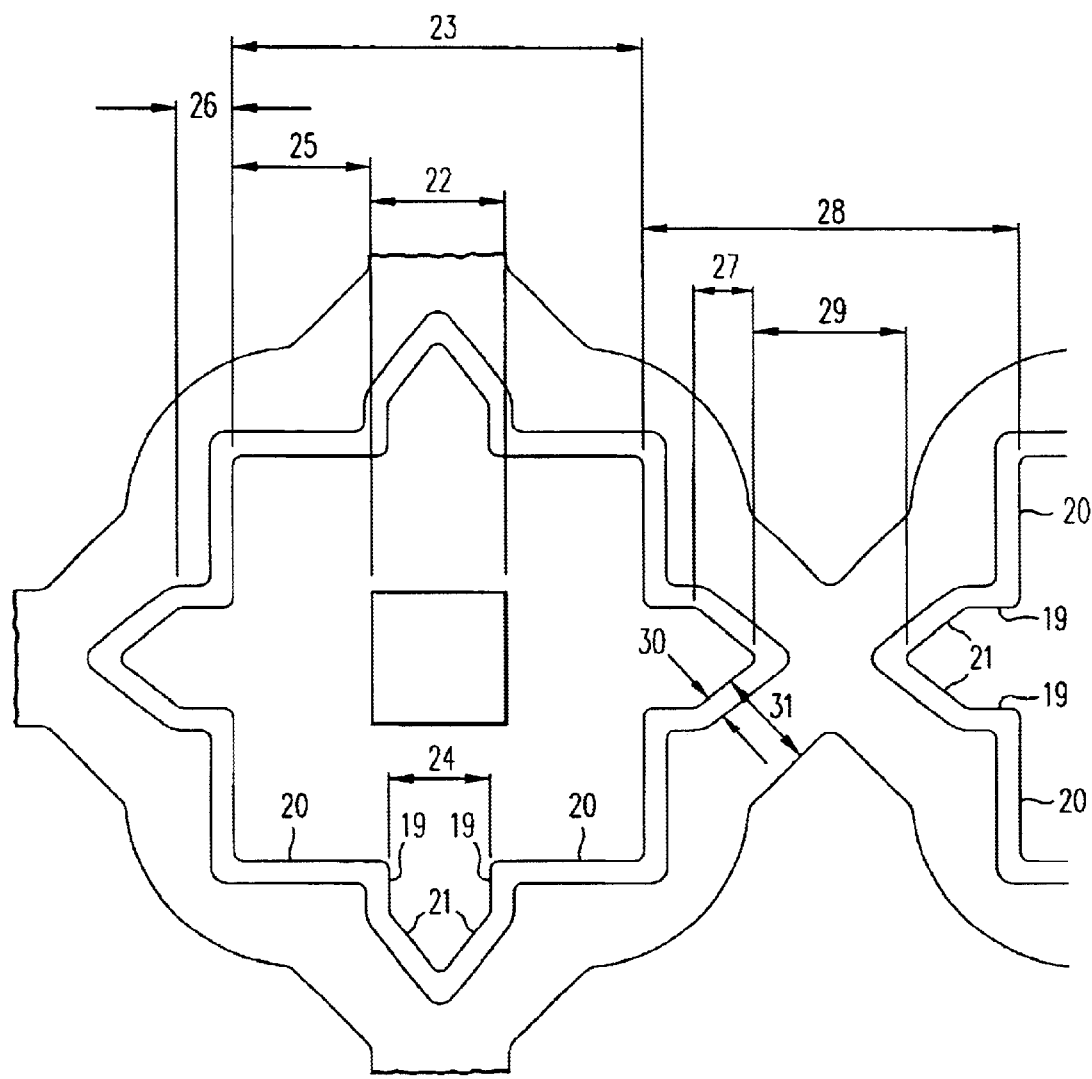
FIG. 8 is a partially cut-away plan view of an arrangement which is an alternative to that shown in FIG. 6.
Figure 9:
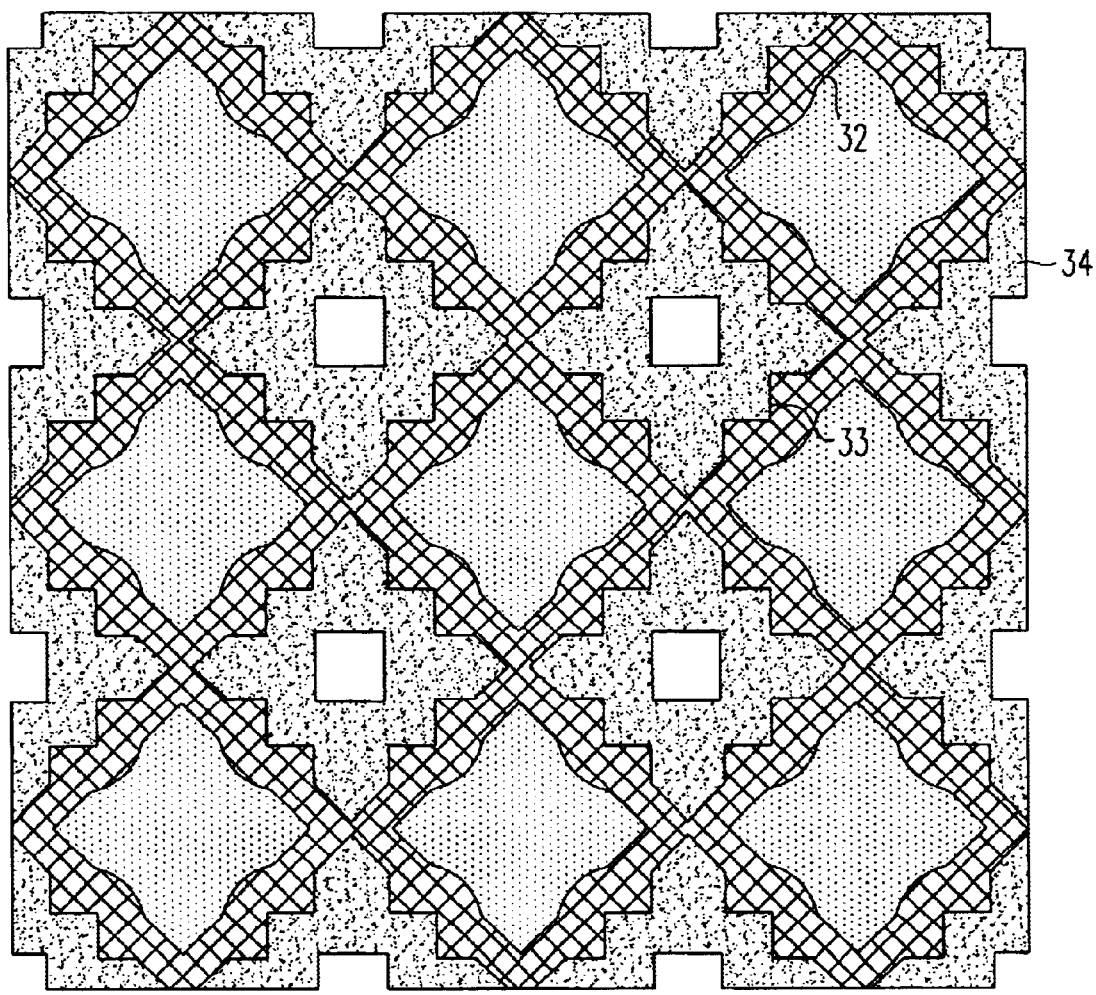
FIG. 9 is a diagram illustrating the relative positions of gate aperture and body region lateral edges based on a simulation of the arrangement of FIG. 8.

FIG. 8 is a view similar to that of FIG. 6 showing edges of two identical gate electrode apertures which have a basic square shape, each side of the square having a central section defining a pair of edges 19 extending parallel to each other and perpendicular to aligned end sections 20, and a pair of edges 21 defining two sides of a triangle and connecting edges 19. The edges 21 are perpendicular to each other. The illustrated dimensions are as follows:

22 (source contact hole side): 1.4 micrometers 23 (gate electrode aperture side): 3.8 micrometers 24 (central extension width): 1.0 micrometers 25 (gap between source contact hole and gate electrode aperture): 1.2 micrometers 26 (central section parallel sides): 0.5 micrometers 27 (central section end): 0.7 micrometers 28 (spacing between square apertures): 3.5 micrometers 29 (spacing between central sections): 1.6 micrometers 30 (source lateral diffusion distance): 0–24 micrometers 31 (body region lateral diffusion distance): 1.0 micrometers FIG. 9 illustrates the relative positions of the lateral edges of the merged body region and the edges of gate apertures based on a simulation of the arrangement described with reference to FIG. 8 above. Lines 32 which in FIG. 9 are defined by the boundaries between light grey and dark grey areas correspond to the positions of the lateral edges of the merged body regions. Lines 33 defined by the boundaries between the dark grey and black areas of FIG. 9 correspond to the edges of the gate apertures. The lines 34 defined between the white and black areas of FIG. 9 correspond to the side edges of the source contact regions which are centrally located in the gate electrode apertures.

Figure 10:
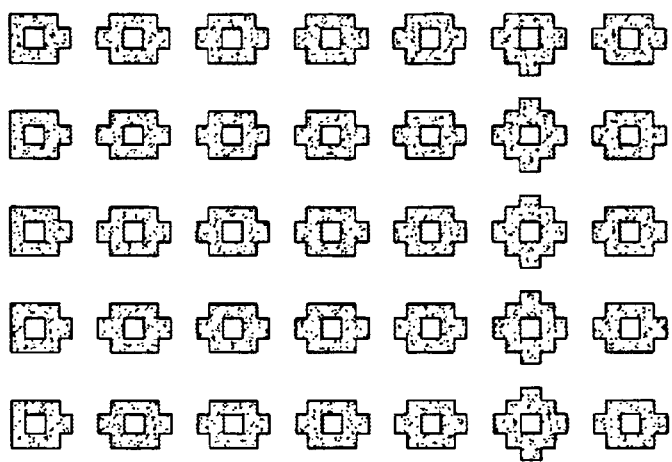
FIG. 10 illustrates a further alternative gate aperture configuration which has been used in an embodiment of the present invention.

Referring to FIG. 10, this schematically illustrates the gate electrode aperture configuration of one embodiment of the invention which has been manufactured and tested and which is further described with reference to FIGS. 11 to 13. In FIG. 10, the grey area corresponds to the gate electrode, the black areas each correspond to one gate electrode aperture, and the white areas correspond to the source contacts. It will be noted that each of the left hand column of gate apertures has only one side extension, extending towards the adjacent aperture in the next to the left column. It will be noted that the apertures in the sixth column of gate electrode apertures define aperture edge extensions extending in the direction of both the two adjacent columns and the or both adjacent rows. As a result of this configuration, merged body regions will be defined beneath each row of gate electrode apertures but those merged body regions extending beneath the rows of apertures will only be merged with the body regions of adjacent rows beneath the sixth column of gate electrode apertures.

Figure 11:
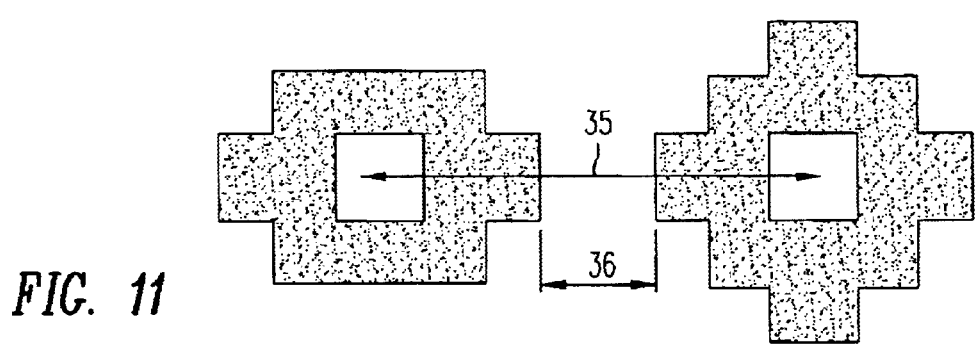
FIG. 11 is an enlarged view of two of the gate apertures of FIG. 10.

FIG. 11 illustrate the gate electrode apertures in greater detail taken from the second row and the fifth and sixth columns of FIG. 10. The line 35 defines the position of a cross-section which is illustrated in FIG. 13. The line 36 indicates the minimum spacing between the extensions of two adjacent gate electrode apertures. That spacing will be the same between any two adjacent gate electrode aperture extensions.

Figure 12:
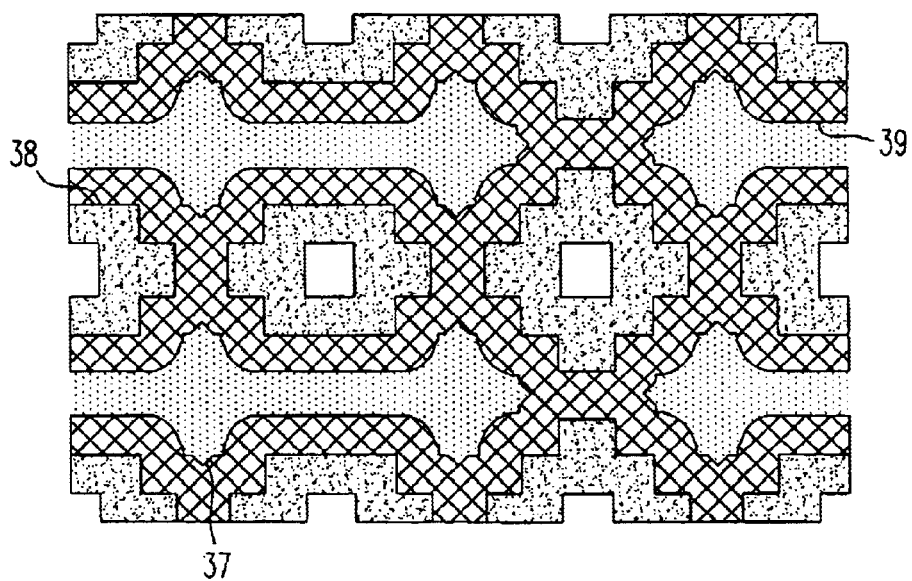
FIG. 12 is a diagram illustrating the position of lateral edges of the merged body region which is achieved using the gate aperture configuration of FIG. 10.

Referring to FIG. 12, this illustrates the position of the lateral edges of the merged body region formed in the vicinity of the fourth, fifth, sixth and seventh columns of the gate electrode aperture array of FIG. 10. Body regions are represented by the dark grey areas 37 and the lateral edges of the gate electrode apertures are indicated by the boundaries 38 between the dark grey areas and the black areas. The lateral edges of the body region are indicated by the boundaries 39 between the light and dark grey areas. Thus it will be seen that the body regions are merged along each of the rows but only along the sixth column of gate electrode apertures.

Figure 13:
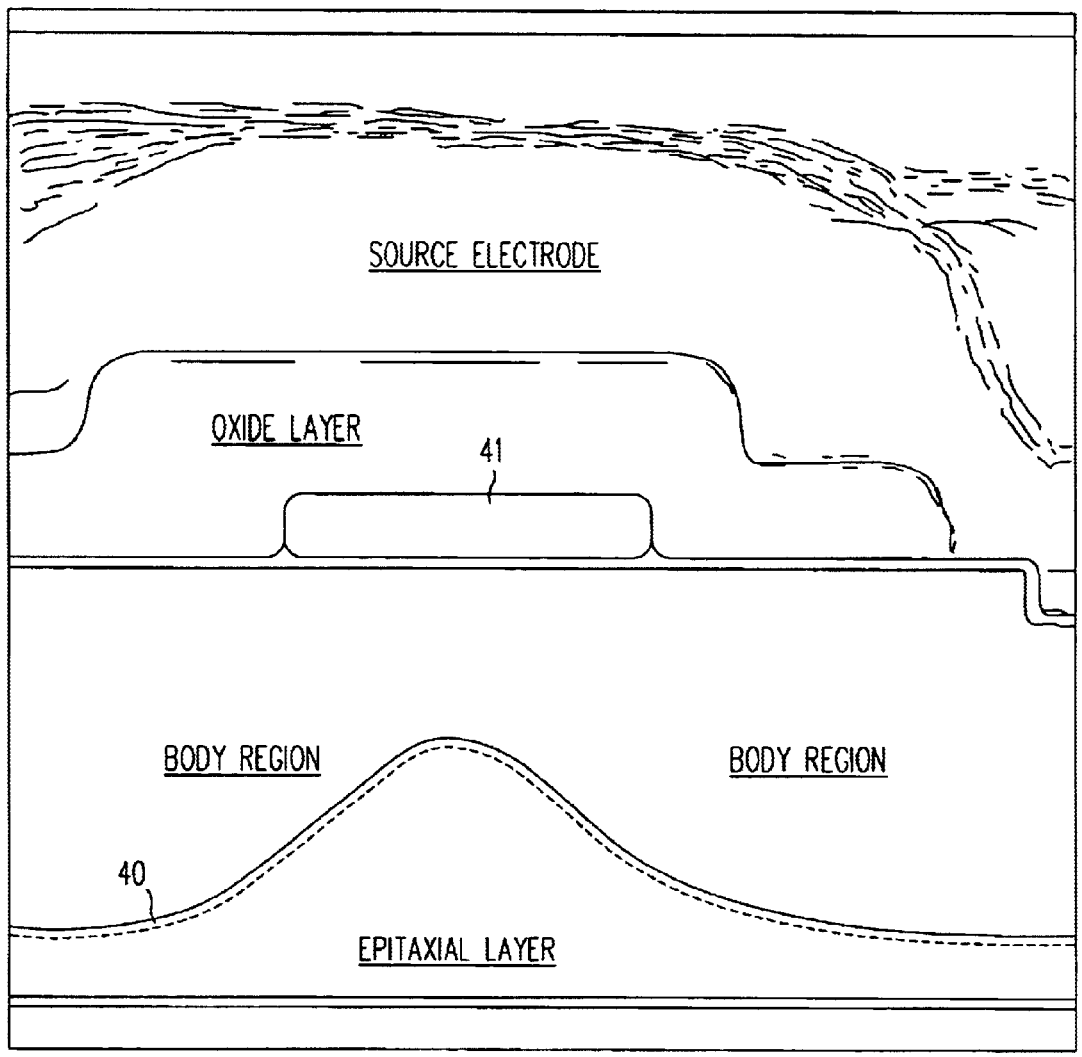
FIG. 13 is a scanning electron microscope image of a cross-section through the embodiment of FIG. 10.

FIG. 13 is an image generated from an engineering sample of the device according to FIGS. 10 to 12. The illustrated cross-section is taken along the line 35 in FIG. 11. The boundary 40 of FIG. 13 corresponds to the junction between the body region and the underlying epitaxial layer. It will be seen that the depth beneath the surface of the junction 40 reduces beneath the gate electrode 41 as a result of formation of the body region being the result of diffusion of dopant laterally beneath the edges of the gate electrode.

In FIG. 10, only one of the seven illustrated columns of gate apertures has a continuous merged body region extending along its length. In a device having N columns of apertures, continuous merged body regions may be arranged to extend along the length of none of the columns or any number of the columns from one to N. The greater the proportion of merged to unmerged body regions beneath the columns, the smaller is the gate/drain overlap, and hence the better is the AC switching performance. Devices may be tailored to suit the DC and AC requirements of particular applications. Simulations indicate that with the general configuration illustrated in FIG. 10, some reduction in DC performance occurs as the proportion of merged to unmerged body regions beneath the columns increases, but it is believed that this will not be the case with other configurations.

Figure 14:
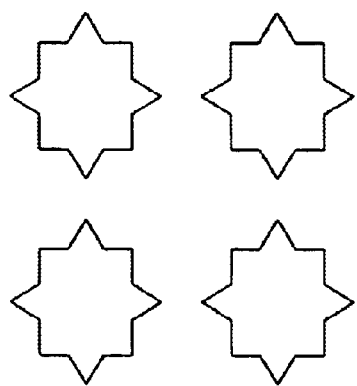

FIG. 14 shows a further alternative gate electrode aperture configuration in which the rectangular central side section for FIGS. 1 to 7 are replaced by triangular central side sections.

Figure 15:
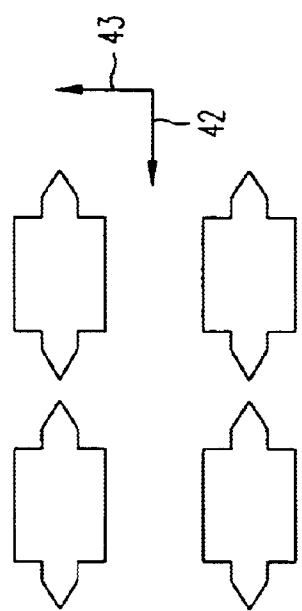
FIGS. 14, 15, 16 and 17 illustrate further alternative aperture configurations.
Figure 16:
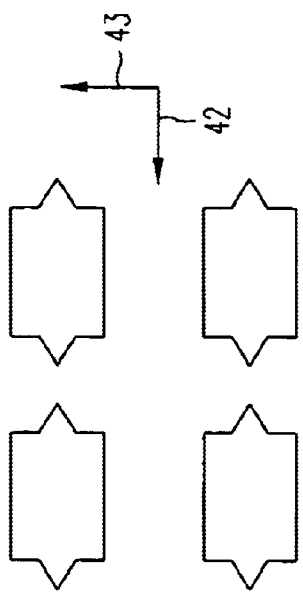

FIGS. 1 to 9 and 14 show arrangements in which the merged body structure is two-dimensional, extending continuously beneath both rows and columns of apertures in a two-dimensional array of apertures. It is possible however as illustrated in FIGS. 10 to 13 to merge the body regions of at least some adjacent apertures in one dimension only such that rows of adjacent apertures extend along single continuous merged body structures but there are discontinuities in the body structures between adjacent rows. FIGS. 15 and 16 show alternative aperture configurations suitable for arrangements in which there are discontinuities in the body structure between adjacent rows. FIG. 15 showing a central side section similar to that of FIGS. 8 and 9, and FIG. 16 showing a central side section similar to that of FIG. 14. With the arrangements of FIGS. 15 and 16, body regions will merge in the direction of arrows 42, but not in the direction of arrows 43.

Figure 17:
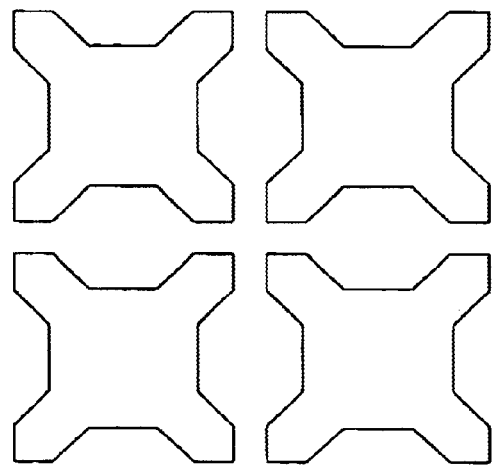

FIG. 17 shows a further alternative gate electrode aperture configuration in which the width of the strips of electrode separating adjacent apertures is at a minimum at the end of each strip rather than at a central position of each strip as in previously described embodiments of the invention. Thus, in the arrangement shown in FIG. 17, each strip of gate electrode is defined by aperture edges which have aligned linear end sections extending on either side of a central section which is offset relative to the end sections so that the end sections define portions of minimum width.

The performance of the particular embodiment of the present invention described with reference to FIGS. 10 to 13 has been compared in tests with the performance of a directly equivalent cellular design (in which the body regions of individual cells are not merged with the body regions of any adjacent cells), and a directly equivalent "stripe" design (in which elongate body regions are formed by diffusing dopant through elongate slots defined in a gate electrode). The results of these tests show that the DC on resistance performance of this particular embodiment of the present invention is marginally worse than with the cellular design but is considerably better than with the striped design. In contrast, the AC switching performance of this particular embodiment of the present invention was inferior to that of the striped design but superior to that of the cellular design. Thus a fabricated and tested embodiment of the present invention has been shown to offer a desirable compromise between DC and AC performance characteristics. For applications in which the total power loss consideration is a combination of significant DC and significant AC elements, devices made in accordance with the tested embodiment of the present invention may afford an optimum solution.

What is claimed is:

1. A power FET device comprising a semiconductor wafer substrate defining first and second surfaces, a gate electrode extending over the first surface of the substrate, the gate electrode being insulated from the substrate and defining an array of apertures aligned in rows and columns, the apertures defining sides at least portions of which extend parallel to the rows and columns, a drain electrode extending over the second surface of the substrate, an FET body region of a first conductivity type formed in the first surface of the substrate beneath each gate electrode aperture and extending a first pre-determined lateral distance beneath edges of the gate electrode defining the aperture, an FET source region of a second conductivity type formed within the body region beneath each gate electrode aperture, each FET source region extending a second pre-determined lateral distance beneath the edges of the gate electrode defining the aperture, a source electrode interconnecting source contacts located beneath each of the gate electrode apertures, and an FET channel region defined around the periphery of each of the source regions beneath the gate electrode, each gate electrode aperture being separated from at least one adjacent gate electrode aperture in the same row or column by a strip of gate electrode the width of which varies along the length of the strip between a maximum which is greater than twice the first distance and a minimum which is greater than twice the second distance and less than twice the first distance, whereby a single body structure extends continuously between said adjacent gate electrode apertures at each position of minimum inter-aperture width due to lateral merging of the body regions at each such position.

2. A power FET device according to claim 1, wherein said strip of gate electrode is defined between edges of adjacent apertures each of which has aligned linear end sections extending on either side of a central section which is offset relative to the respective end sections so that a minimum width portion of said strip of gate electrode is defined between the central sections of adjacent apertures.

3. A power FET device according to claim 2, wherein the central section of each edge is defined by three edge portions forming three sides of a rectangle one side of which is parallel to but offset from aligned end sections of the edge and two sides of which are perpendicular to said one side.

4. A power FET device according to claim 3, wherein each source contact is of the same peripheral shape as and is centrally located within the respective gate electrode aperture, and each side of the source contact is of the same length as said one side of the central section of the aperture edge.

5. A power FET according to claim 2, wherein the central section of each edge is defined by a pair of edge portions of which extend towards one another.

6. A power FET according to claim 2, wherein the central section of each edge is defined by a first pair of edge portions each extending from a respective end section perpendicular to the end sections, and a second pair of edge portions each extending towards one another from a respective one of said first pair of edge portions.

7. A power FET device according to claim 1, wherein said strip of gate electrode is defined between edges of adjacent apertures each of which have aligned linear end sections extending on either side of a central section which is offset relative to the respective end sections so that the minimum width portions of said strip of gate electrode are defined between opposing end sections of adjacent apertures.

8. A power FET according to claim 1, wherein the gate electrode apertures are configured such that the single body structure extends continuously between each adjacent pair of apertures.

9. A power FET according to claim 1, wherein the gate electrode apertures are configured such that the single body structure extends continuously along the length of rows of adjacent apertures, the body regions of at least some columns of adjacent apertures being discontinuous.

10. A power FET according to claim 1, wherein each gate electrode aperture is generally square and with extended sections, the minimum width portions of said strip of gate electrode being defined between said extended sections.

11. A power FET device according to claim 1, wherein said apertures define a regular array such that immediately adjacent apertures are arranged in a rectangular pattern.

* * * * *

UNITED STATES PATENT AND TRADEMARK OFFICE
CERTIFICATE OF CORRECTION

PATENT NO. : 6,703,664 B1
DATED : March 9, 2004
INVENTOR(S) : Paul Antony Jerred It is certified that error appears in the above-identified patent and that said Letters Patent is hereby corrected as shown below:

<u>Title page,</u>
Item [75], Inventor, delete "Paul Anthony Jerred" and insert -- Paul Antony Jerred --.

Signed and Sealed this

Twenty-second Day of June, 2004

JON W. DUDAS
*Acting Director of the United States Patent and Trademark Office*